United States Patent [19]

Held

[11] 4,416,968
[45] Nov. 22, 1983

[54] PREPARATION OF A PRINTING MASTER BY TONING A PHOTOPOLYMER FILM WITH MAGNETIC TONER

[75] Inventor: Robert P. Held, Englishtown, N.J.

[73] Assignee: E. I. Du Pont de Nemours & Co., Wilmington, Del.

[21] Appl. No.: 416,362

[22] Filed: Sep. 9, 1982

Related U.S. Application Data

[62] Division of Ser. No. 295,246, Aug. 24, 1981.

[51] Int. Cl.³ .......................... G03C 5/54; G03C 5/00; B41F 7/00; G02B 7/06
[52] U.S. Cl. .................................... 430/199; 101/130; 101/DIG. 5; 346/74.4; 346/135.1; 360/131
[58] Field of Search ............... 430/199, 291; 346/74.4, 346/135.1; 360/131; 101/395, DIG. 5, 130

[56] References Cited

U.S. PATENT DOCUMENTS

| | | | |
|---|---|---|---|
| 3,062,023 | 10/1962 | Burg et al. | 96/28 |
| 3,062,024 | 10/1962 | Burg et al. | 96/28 |
| 3,202,508 | 8/1965 | Heiart | 96/28 |
| 3,649,268 | 3/1972 | Chu et al. | 430/291 |
| 3,718,466 | 2/1973 | Schreckendgost | 430/291 |
| 3,804,511 | 4/1974 | Rait et al. | 430/126 |
| 4,101,320 | 7/1978 | Sellers et al. | 430/126 |
| 4,207,101 | 6/1980 | Vola et al. | 430/126 |

*Primary Examiner*—Richard L. Schilling

[57] ABSTRACT

A dry-printing process which employs a photopolymer film and two toners, one for generating a master and a second for image transfer.

3 Claims, 5 Drawing Figures

PREPARATION OF A PRINTING MASTER BY TONING A PHOTOPOLYMER FILM WITH MAGNETIC TONER

This is a division of application Ser. No. 295,246 filed Aug. 24, 1981.

BACKGROUND OF THE INVENTION

1. Technical Field

This invention relates to the preparation and use of a magnetic printing master for use in preparing multiple copies of an original photopolymer image.

2. Background Art

It is known in the art of image reproduction to imagewise expose a photopolymerizable surface, to dust the surface with fine particles of dyes or pigments (toner) to form a visible image, and to thermally transfer this to the surface of a separate element or receptor. Toning of a photopolymerizable surface with magnetic iron powder for this purpose is disclosed in Burg and Cohen, U.S. Pat. Nos. 3,060,023 "Image Reproduction Processes" (1962) and 3,060,024 "Photopolymerization Process for Reproducing Images" (1962), while Chu and Cohen, U.S. Pat. No. 3,649,268 "Process for Forming Images by Photohardening and Applying a Colorant" (1972) disclose similar toning of a photohardenable surface. Heiart, U.S. Pat. No. 3,202,508, also discloses that magnetic iron may serve as a useful pigment for a transfer process involving a photopolymer layer protected by a cover sheet. Other modes of magnetic toning are known, e.g., Schreckendgust, U.S. Pat. No. 3,718,466 "Magnetic Development" (1973), Jellers and Malkani, U.S. Pat. No. 4,101,320 "Magnetic Imaging Method" (1978), and Vola and Draai, U.S. Pat. No. 4,207,101 "Process for Magnetically Transferring a Powder Image" (1980). However, these do not describe or suggest preparation of a magnetic master useful for multiple imaging by thermal transfer. The principal object of the present invention is to provide such a master, whereby the excellent image quality characteristics of photopolymers may be used in a dry printing process to produce multiple copies of an original image.

SUMMARY OF THE INVENTION

A photopolymerizable layer on a support is imagewise exposed to generate tacky areas on its surface, and is developed with a first magnetic toner, composed of ferromagnetic particles, which is embedded in the tacky areas of the surface, thereby producing a so-called magnetic master. In the preferred embodiment the master is subjected to a magnetic field in order to align the first magnetic toner particles in the tacky areas, and the master is then exposed overall so as to obtain a fully photopolymerized, nontacky surface.

In order to use this master in dry printing, it is toned with a second magnetic toner (also called a transfer toner), which adheres imagewise to the first magnetic toner. The resulting doubly toned master is brought into contact with a receiving element (receptor) and heat and pressure is applied to cause the second toner to adhere to the receiving element. Temperatures of from 80° to 120° C. and pressures of 5 to 15 kg/linear cm are effective for the toner transfer. This process may be repeated to form multiple copies. In addition, different masters may be used with the same receiving element to produce a colored reproduction on the receiving element. It is preferred to apply added polymer along with the second toner.

In its best mode, the invention is a process for preparing a magnetic printing master for use in dry printing which comprises exposing imagewise to actinic radiation a photopolymerizable layer on a support, so as to generate imagewise tacky and nontacky areas on said support, the tacky areas being those which did not receive radiation, and the nontacky areas being those areas which received radiation; applying to the exposed surface a first magnetic toner comprising ferromagnetic metal oxide particles; simultaneously subjecting the toned surface to a magnetic field, thereby aligning the magnetic particles in the surface of said tacky areas; and then post-exposing said photohardenable element, overall; whereby a printing master is formed which can be dusted with a second magnetic toner which adheres to the first toner and is transferrable to a receptor surface.

DETAILED DESCRIPTION OF THE INVENTION

Photopolymerizable film-forming compositions suitable for the practice of the present invention are described in U.S. Pat. No. 3,060,023 by title at column 3, line 6 to column 4, line 60; and U.S. Pat. No. 3,202,508 at col. 2, lines 21–36, and in column 3, line 36 to column 5, line 56. The foregoing excerpts are incorporated herein by reference. Typically, such compositions comprise (a) a thermoplastic compound solid at 50° C., and (b) an ethylenically unsaturated compound containing at least one terminal ethylenic group, having a boiling point above 100° C. at normal atmospheric pressure, being capable of forming a high polymer by photoinitiated addition polymerization and having plasticizing action on said thermoplastic polymeric compound; said constituents (a) and (b) being present in amounts from 3 to 97 and 97 to 3 parts by weight, respectively. Representative films are available from E. I. du Pont de Nemours and Company (Photo Products), Wilmington, Del. under the CROMALIN trademark, e.g., films such as Cromalin Overlay Film and Negative Working Cromalin film. Other films suitable for the practice of the present invention would have a similar property of providing tacky areas upon imagewise exposure.

Ferromagnetic particles suitable for preparing the magnetic master include iron, iron oxide, and chromium dioxide with a 0.3 to 40 micron particle size. These particles may be applied by dusting, and removed in nontacky areas by brushing.

Suitable transfer toner particles may comprise iron, iron oxides, chromium dioxide, alloys, etc. These may be in substantially pure form or they may also comprise various pigments, binders, or additives to impart useful functions in said toner particles. Particle sizes of from 0.3 to 40 microns are useful for practice of the present invention.

Thermal transfer may be accomplished as the magnetic master, having attached thereto the magnetically attracted second toner, is compressed against a receptor and heat is supplied from the contact surfaces or other indirect means.

The receptor, as well as the support for the photopolymerizable layer, may comprise one of a variety of materials, which may be flexible or rigid, opaque or transparent, e.g., plastic, paper, metal, etc. The prerequisite for the receptor is that the anchorage between the surface and the second magnetic toner must be sufficient to overcome the attractive force of the magnetic master toner after the application of heat and pressure.

DETAILED DESCRIPTION OF THE DRAWINGS

Figure 1:
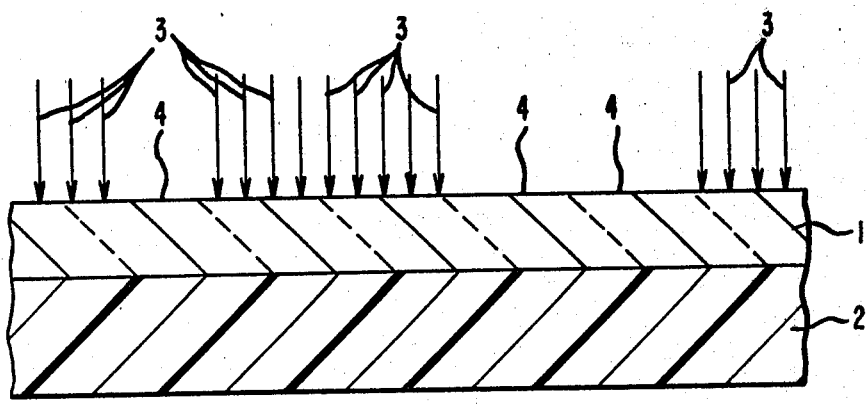
FIG. 1 illustrates schematically and in cross-section the exposure of a photopolymerizable film of the invention.

FIG. 1. A support 2 coated with a tacky photopolymerizable layer 1 is imagewise exposed to light rays 3. Areas 4 of the photopolymerizable layer are not irradiated by rays 3 so they remain tacky. Optionally the film may have a transparent cover sheet (not shown) over the photopolymerizable layer 1 during the exposure, and this cover sheet is afterwards removed for toning.

Figure 2:
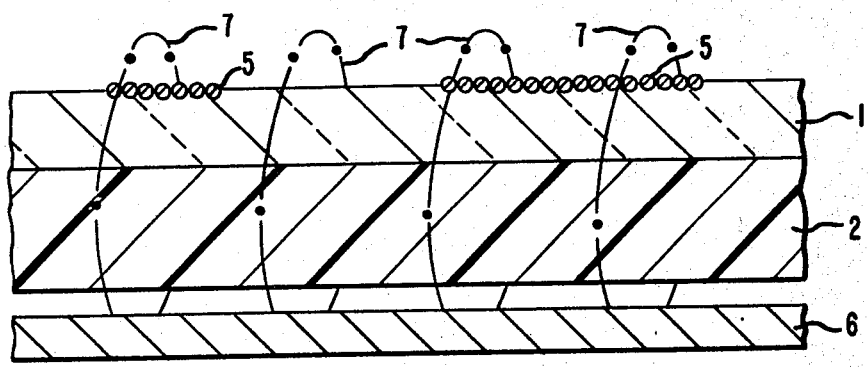
FIG. 2 illustrates the film of FIG. 1 toned with ferromagnetic particles in a magnetic field.

FIG. 2. Ferromagnetic powder toner 5 is contacted under pressure with the unexposed tacky surface 4 of layer 1, and it adheres thereto, but not to the photopolymerizable areas. A magnet 6 exerts a field 7 which aligns the particles. The result is a magnetic master wherein the ferromagnetic toner 5 serves to develop the latent image.

Figure 3:
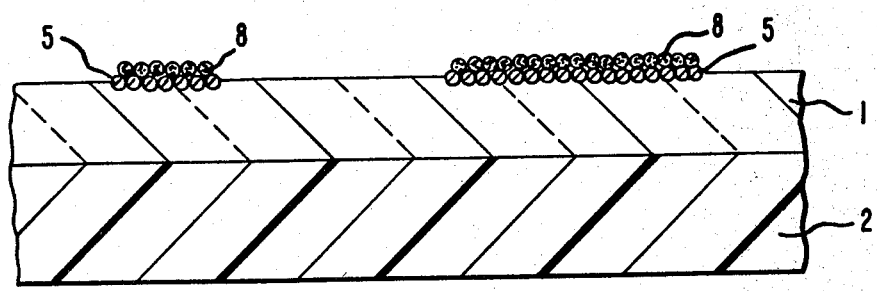
FIG. 3 illustrates application of a second magnetic toner to the film of FIG. 2.

FIG. 3. A second ferromagnetic toner 8 is magnetically attracted to the first ferromagnetic toner 5. Optionally the second toner 8 may be black or one of a variety of colors.

Figure 4:
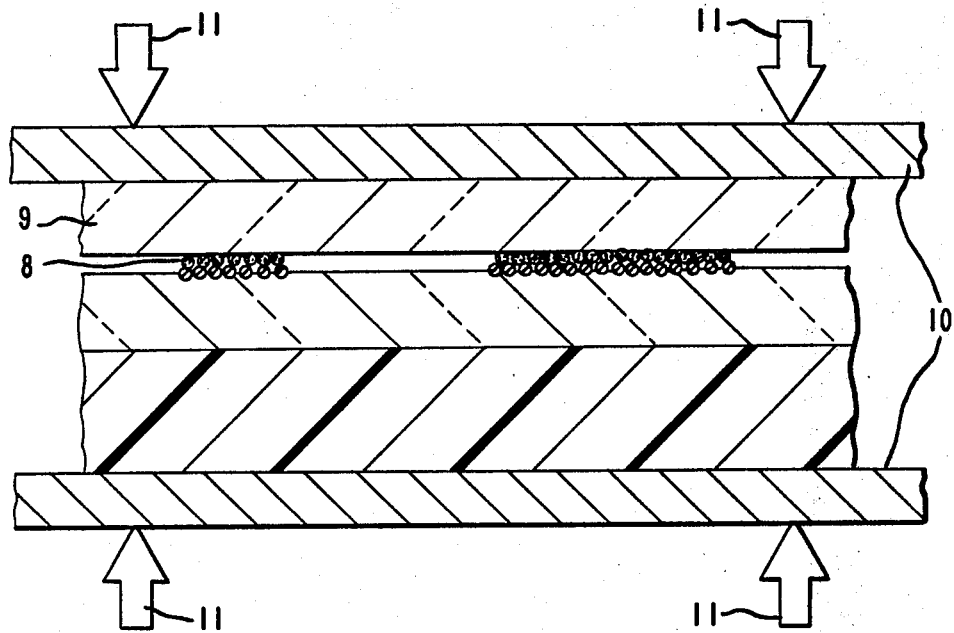
FIG. 4 illustrates contacting the films of FIG. 3 with a receptor under heat and pressure.

FIG. 4. A receiving element 9 is contacted with the second toner 8 and the assembly is placed between plates 10 with the application of pressure 11 and heat. Under the influence of the heat and pressure the second toner 8 forms sufficient adherent attraction to the receiving element 9 that when the pressure is released the magnetic attraction of the first toner 5 on the magnetic master is no longer strong enough to attract the second toner 8 and it remains on the receiving element 9.

Figure 5:
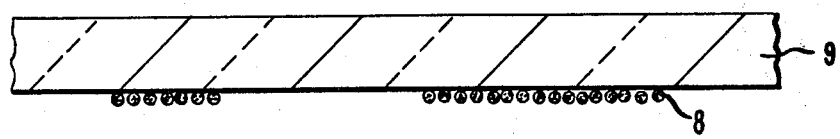
FIG. 5 illustrates the imaged receptor.

FIG. 5. The end result is a receiving element 9 which is a copy of the original image, with the second toner 8 located in correspondence with the original imaging of the magnetic master. This same element may be imaged by other masters to produce a color reproduction. The application of the second magnetic toner 5 and its transfer to a receptive surface may be used to generate multiple copies.

The following examples serve to illustrate the practice of the present invention. Example 1 represents the best mode.

EXAMPLE 1

Cromalin Overlay Film, which consists of a tacky photopolymerizable layer between protective polypropylene and MYLAR polyester sheets, was imaged with a contact exposure through a film positive for 40 units of low intensity exposure using a nuArc® 4 KW, pulsed xenon arc platemaker at a lamp to frame distance of 63.5 cm. High coercivity acicular particles of chromium dioxide served as a toner which was adhered imagewise to the tacky areas on the film surface. Toning was accomplished with a barrel magnet under the film in order to align dipoles of the chromium dioxide in the tacky areas and to pull the particles into this layer.

The Cromalin film with the chromium dioxide particles thus aligned and embedded therein was then given a 2 minute post exposure to fix the particles in the photopolymer film to produce a magnetic master.

A transfer toner was used to tone this magnetic master, and comprised, in parts by weight, a 45/5/50 mixture of ATLAC 382 (an ICI Ltd. polyester resin), triphenyl phosphate, and $Fe_3O_4$ of under 8 micron particle size. This transfer toner had a melting point of 60° C. With a laminator set at 100° C. and under a pressure of 7 Kg per linear cm, the toner was transferred to an aluminum sheet. The magnetic master was toned again and transferred to a copper clad circuit board. The magnetic master was also toned again and transferred to seven point KROMEKOTE paper (trademark of Champion International Co.). High resolution images were obtained in these tests.

EXAMPLE 2

A magnetic master was prepared as in Example 1 except that magnetite particles of under 10 micron size were used in place of chromium dioxide.

In addition to the transfer toner used in Example 1 a transfer toner of 50/50 by weight $Fe_3O_4$ and ICI Ltd's polyester resin ATLAC 580E was used. High resolution images were produced on aluminum, copper and paper.

EXAMPLE 3

The process of Example 2 was repeated except that the use of the magnetic field was omitted during the preparation of the magnetic master. Satisfactory images were obtained when the magnetic master was toned and transferred, but the resolution was lower than when the magnetic field was used. Four repetitions of the toning process all gave comparable images.

EXAMPLE 4

The process of Example 1 was repeated except that the transfer toner comprised, in parts by weight, a 50/25/25 mixure of VERSAMID 930 polyamide resin from Henzel Adhesives, iron, and $Fe_3O_4$, both the iron and $Fe_3O_4$ being under 10 micron particle size. This transfer toner had a melting point of 120° C. The image produced with this higher melting toner were not as sharp as those of Example 1.

EXAMPLE 5

CROMALIN C4/CNII film, available from E. I. du Pont de Nemours and Company, (U.S. Pat. No. 4,247,619) was laminated to Baryta Paper, available from Intermills of Belgium. The laminated film was given a pulsed xenon arc exposure of 70 units through a negative target. The cover sheet was removed to reveal the image by peel-apart. The surface was then toned with magnetite, given a post exposure of 70 units to harden the remaining photopolymer, and then toned with the transfer toner of Example 2. This toner was transferred to a transparent cellulose acetate film using a lamination set at 110°. The master was then retoned with the transfer toner of Example 1 and again transferred to cellulose acetate film. The process was then repeated to produce a third image film.

I claim:
1. A process of dry printing which comprises:

(1) preparing a magnetic printing master by exposing imagewise to actinic radiation a photopolymerizable layer on a support, so as to generate imagewise tacky and nontacky areas on said support, the tacky areas being those which did not receive radiation, and the nontacky areas being those areas which received radiation; applying to the exposed surface a first magnetic toner comprising ferromagnetic metal oxide particles; simultaneously subjecting the toned surface to a magnetic field, thereby aligning the ferromagnetic particles in the surface of said tacky areas; and then post-exposing said photohardenable element, overall; whereby a printing master is formed which can be dusted with a second magnetic toner which adheres to the first toner and is transferable to a receptor surface; and (2) preparing one or more copies of the image on the resulting magnetic printing master by toning said master with a second magnetic toner, with added polymer, which adheres to the first magnetic toner on the master, and (3) contacting the doubly toned surface with a receptor surface, while applying heat and pressure, causing the second toner with added polymer to adhere to the receptor surface.

2. The process of claim 1 wherein the application of the second toner, with added polymer, and its transfer to the receptor surface, is repeated so as to print multiple copies.

3. The process of claim 1 wherein the receptor is paper.

* * * * *